United States Patent
Kato et al.

(10) Patent No.: US 10,855,010 B2
(45) Date of Patent: Dec. 1, 2020

(54) FIXING STRUCTURE OF CABLE TO WIRING SUBSTRATE, AND CABLE, AND MANUFACTURING METHOD OF CABLE

(71) Applicant: Murata Manufacturing Co., Ltd., Nagaokakyo (JP)

(72) Inventors: Noboru Kato, Nagaokakyo (JP); Masahiro Ozawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/456,698

(22) Filed: Mar. 13, 2017

(65) Prior Publication Data
US 2017/0187132 A1    Jun. 29, 2017

Related U.S. Application Data

(63) Continuation of application No. 14/564,143, filed on Dec. 9, 2014, now Pat. No. 9,647,312, which is a (Continued)

(30) Foreign Application Priority Data

Jun. 29, 2012  (JP) .................................. 2012-147022

(51) Int. Cl.
*H01R 12/62* (2011.01)
*H01P 1/04* (2006.01)
(Continued)

(52) U.S. Cl.
CPC ............. *H01R 12/62* (2013.01); *H01P 1/047* (2013.01); *H01P 3/08* (2013.01); *H01P 3/085* (2013.01);
(Continued)

(58) Field of Classification Search
CPC ....... H01R 12/62; H01R 12/613; H01P 1/047; H01P 3/08
(Continued)

(56) References Cited

U.S. PATENT DOCUMENTS 5,631,446 A * 5/1997 Quan ..................... H01R 12/62
174/254
5,689,216 A * 11/1997 Sturdivant ............... H01P 5/08
333/260
(Continued)

OTHER PUBLICATIONS

Kato et al., "Fixing Structure of Cable to Wiring Substrate, and Cable, and Manufacturing Method of Cable", U.S. Appl. No. 14/564,143, filed Dec. 9, 2014.

*Primary Examiner* — Samuel S Outten
(74) *Attorney, Agent, or Firm* — Keating & Bennett, LLP

(57) ABSTRACT

A transmission line includes an insulator as a base member, a transmission conductor, and a ground layer. A connector is provided at a wiring substrate to fix the transmission line. The transmission line includes a signal columnar conductor having a solid columnar shape integrated with the transmission conductor, and ground columnar conductors having solid columnar shapes integrated with the ground layer. The connector has a through hole corresponding to the signal columnar conductor, and through holes corresponding to the ground columnar conductors. Conductive films are respectively provided on the inner peripheral surfaces of the through holes. The signal columnar conductor is inserted into the through hole, and the ground columnar conductors are respectively inserted into the through holes.

4 Claims, 15 Drawing Sheets

Related U.S. Application Data continuation of application No. PCT/JP2013/061839, filed on Apr. 23, 2013.

(51) Int. Cl.

| | | |
|---|---|---|
| *H05K 1/14* | (2006.01) | |
| *H05K 3/36* | (2006.01) | |
| *H01P 3/08* | (2006.01) | |
| *H01P 5/08* | (2006.01) | |
| *H01R 12/53* | (2011.01) | |
| *H01R 12/61* | (2011.01) | |
| *H05K 1/02* | (2006.01) | |

(52) U.S. Cl.
CPC ............ *H01P 5/085* (2013.01); *H01R 12/53* (2013.01); *H01R 12/613* (2013.01); *H05K 1/148* (2013.01); *H05K 3/361* (2013.01); *H05K 1/0222* (2013.01); *H05K 2201/2072* (2013.01)

(58) Field of Classification Search
USPC .......................................................... 333/238
See application file for complete search history.

(56) References Cited

U.S. PATENT DOCUMENTS

| | | | |
|---|---|---|---|
| 6,930,240 B1* | 8/2005 | Giboney | H05K 3/361 |
| | | | 174/393 |
| 6,933,450 B2* | 8/2005 | Okumichi | H01L 23/49827 |
| | | | 174/255 |
| 2009/0233465 A1* | 9/2009 | Mizoguchi | H01R 12/58 |
| | | | 439/74 |
| 2010/0285676 A1* | 11/2010 | Ikeuchi | H01R 12/57 |
| | | | 439/65 |

\* cited by examiner

SH3
SH2
SH1

HL-G1  HL-G2

24
22
26

EL-G1  EL-G2

FIXING STRUCTURE OF CABLE TO WIRING SUBSTRATE, AND CABLE, AND MANUFACTURING METHOD OF CABLE

BACKGROUND OF THE INVENTION

1. Field of the Invention

The present invention relates to a fixing structure of a cable to a wiring substrate, and more particularly to a fixing structure that fixes a cable, in which an elongated transmission conductor configured to transmit a signal is provided at an insulating sheet defining and serving as a base member, to a fixing portion provided at a wiring substrate.

The present invention also relates to a cable which is applied to such a fixing structure, or a manufacturing method of the cable.

2. Description of the Related Art

A coaxial cable is a representative example of a high-frequency transmission line for connecting a high-frequency circuit or a high-frequency element. The coaxial cable is formed of a central conductor and a shield conductor provided around the central conductor. The coaxial cable is frequently used for various kinds of high-frequency electronic devices because the coaxial cable resists bending and deformation, and is cheap.

If such a coaxial cable is connected with the high-frequency circuit or the high-frequency element, for example, a connector as disclosed in International Publication No. 2009/130964 is used for the connection.

However, this connector requires a complicated manufacturing process of, for example, bending a metal sheet and applying resin molding to the metal sheet. Hence, it is difficult to manufacture a small and highly precise connector, and the connector is expensive. Also, a step of connecting and mounting the connector to the cable is required. However, it is difficult to ensure its connection reliability as the connector and the cable are reduced in size.

SUMMARY OF THE INVENTION

Therefore, preferred embodiments of the present invention provide a fixing structure of a cable to a wiring substrate, the fixing structure providing an easy and reliable fixing structure.

Other preferred embodiments of the present invention provide a cable which provides an easy and reliable fixing structure.

Still other preferred embodiments of the present invention provide a manufacturing method of a cable which produces an easy and reliable fixing structure.

A fixing structure of a cable to a wiring substrate according to a preferred embodiment of the present invention includes a cable including an insulating sheet defining a base member, and an elongated transmission conductor configured to transmit a signal; and a fixing portion provided at the wiring substrate, to fix the cable. The cable further includes a protrusion-shaped connection conductor preferably having a solid columnar shape protruding in a thickness direction of the insulating sheet. The fixing portion preferably has a shape corresponding to a shape of the protrusion-shaped connection conductor, and a hole-shaped connection conductor (EL-S, EL-G1 to EL-G4, EL-S1 to EL-S3) with a conductor provided on an inner peripheral surface of the hole-shaped connection conductor. The protrusion-shaped connection conductor is inserted into the hole-shaped connection conductor.

Preferably, the insulating sheet is flexible.

Preferably, the protrusion-shaped connection conductor includes a first protrusion-shaped connection conductor connected with the transmission conductor.

Further preferably, the transmission conductor includes a plurality of long transmission conductive members, and the first protrusion-shaped connection conductor includes a plurality of connection conductive members respectively connected with the plurality of transmission conductive members.

Preferably, the cable further includes a ground conductor including a ground potential, and the protrusion-shaped connection conductor includes a second protrusion-shaped connection conductor connected with the ground conductor.

A fixing structure of a cable to a wiring substrate according to a preferred embodiment of the present invention includes a cable including an insulating sheet as a base member, and an elongated transmission conductor configured to transmit a signal; and a fixing portion provided at the wiring substrate, to fix the cable. The fixing portion includes a terminal conductor electrically coupled with a terminal of the wiring substrate, and a protrusion-shaped connection conductor integrated with the terminal conductor and preferably having a solid columnar shape. The cable has a shape corresponding to a shape of the protrusion-shaped connection conductor, and further includes a hole-shaped connection conductor with a conductor provided on an inner peripheral surface of the hole-shaped connection conductor. The protrusion-shaped connection conductor is inserted into the hole-shaped connection conductor.

Preferably, the terminal of the wiring substrate includes a plurality of terminal members configured to transmit the signal. The terminal conductor includes a plurality of terminal conductive members respectively corresponding to the plurality of terminal members. The protrusion-shaped connection conductor includes a plurality of protrusion-shaped conductive members respectively corresponding to the plurality of terminal conductive members. The hole-shaped connection conductor includes a plurality of hole-shaped conductive members respectively corresponding to the plurality of protrusion-shaped conductive members.

Preferably, a hole forming the hole-shaped connection conductor corresponds to a through hole penetrating through principal surfaces of the insulating sheet.

A cable according to a preferred embodiment of the present invention includes an insulating sheet defining and serving as a base member, and an elongated transmission conductor configured to transmit a signal, the cable being configured to be fixed to a fixing portion including a hole-shaped connection conductor with a conductor electrically coupled with a terminal of a wiring substrate provided on an inner peripheral surface of the fixing portion. The cable further includes a protrusion-shaped connection conductor preferably having a shape corresponding to a shape of the hole-shaped connection conductor, that is, a solid columnar shape protruding in a thickness direction of the insulating sheet, and being configured to be inserted into the hole-shaped connection conductor.

A manufacturing method according to another preferred embodiment of the present invention includes filling a first conductive material in a first hole formed in principal surfaces of an insulating sheet including a transmission conductor so that the first hole reaches the transmission conductor; filling a second conductive material in a second hole formed in principal surfaces of an auxiliary sheet; metalizing the first conductive material and the second conductive material simultaneously by bonding the auxiliary sheet and the insulating sheet by thermal compression bonding while the auxiliary sheet is stacked on the insulating sheet so that an opening portion of the second hole faces an opening portion of the first hole; and removing the auxiliary sheet.

With various preferred embodiments of the present invention, the protrusion-shaped connection conductor provided at the cable preferably has a solid columnar shape protruding in the thickness direction of the insulating sheet. Also, the shape of the hole-shaped connection conductor provided at the fixing portion corresponds to the shape of the protrusion-shaped connection conductor, and the conductor is provided in the inner peripheral surface of the hole-shaped connection conductor. Hence, when the protrusion-shaped connection conductor is inserted into the hole-shaped connection conductor, the transmission conductor is connected with the wiring substrate through the protrusion-shaped connection conductor and the hole-shaped connection conductor. Accordingly, the easy and reliable fixing structure is provided.

Also, with various preferred embodiments of the present invention, the protrusion-shaped connection conductor provided at the fixing portion preferably has a solid columnar shape and preferably is integrally formed with the connection conductor. Also, the shape of the hole-shaped connection conductor provided at the cable corresponds to the shape of the protrusion-shaped connection conductor, and the terminal conductor electrically connected with the transmission conductor is provided on the inner peripheral surface of the hole-shaped connection conductor. Hence, when the protrusion-shaped connection conductor is inserted into the hole-shaped connection conductor, the transmission conductor is connected with the terminal of the wiring substrate through the hole-shaped connection conductor and the protrusion-shaped connection conductor. Accordingly, the easy and reliable fixing structure is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
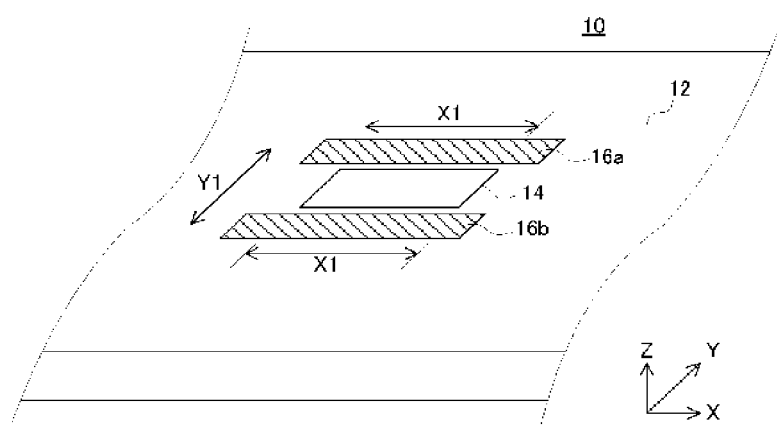
FIG. 1 is a perspective view showing a wiring substrate according to a preferred embodiment of the present invention.

Referring to FIG. 1, a printed wiring substrate (hereinafter, merely referred to as "wiring substrate") 10 according to a preferred embodiment of the present invention includes an insulating (dielectric) substrate member 12 preferably having rectangular or substantially rectangular principal surfaces. The long sides and the short sides of each rectangle defining the principal surface of the substrate member respectively extend along the X axis and the Y axis. The thickness (height) of the substrate member 12 extends along the Z axis. In the following description, the principal surface facing the positive side in the Z-axis direction is called "upper surface," and the principal surface facing the negative side in the Z-axis direction is called "lower surface," if necessary.

A wiring conductor and a ground conductor (both not shown) are embedded in the substrate member 12. Also, a single signal terminal 14, which is electrically connected with the wiring conductor, and two ground terminals 16a and 16b, which are electrically coupled with the ground conductor, are provided on the upper surface of the substrate member 12. The signal terminal 14, and the ground terminals 16a and 16b have rectangular or substantially rectangular principal surfaces and are formed in plate-shaped configurations.

The signal terminal 14, and the ground terminals 16a and 16b are provided at predetermined positions on the upper surface of the substrate member 12 in a posture in which long sides of each of the rectangles defining the principal surfaces of the signal terminal 14, and the ground terminals 16a and 16b extend along the X axis, and the ground terminals 16a and 16b sandwich the signal terminal 14 in the Y-axis direction. Also, the length in the X-axis direction of each of the ground terminals 16a and 16b is larger than "X1," and the distance between the ground terminals 16a and 16b in the Y-axis direction corresponds to "Y1."

Figure 2:
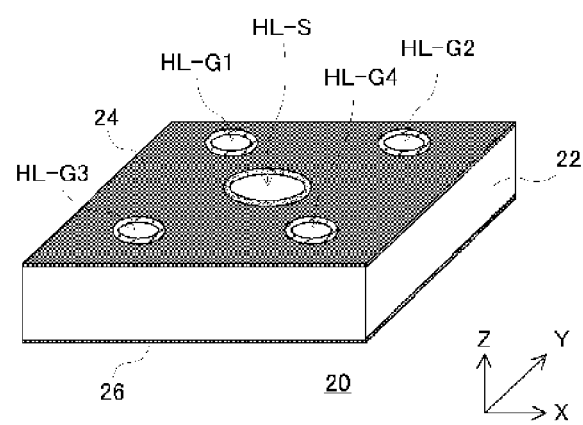
FIG. 2 is a perspective view showing a connector according to a preferred embodiment of the present invention.
Figure 3:
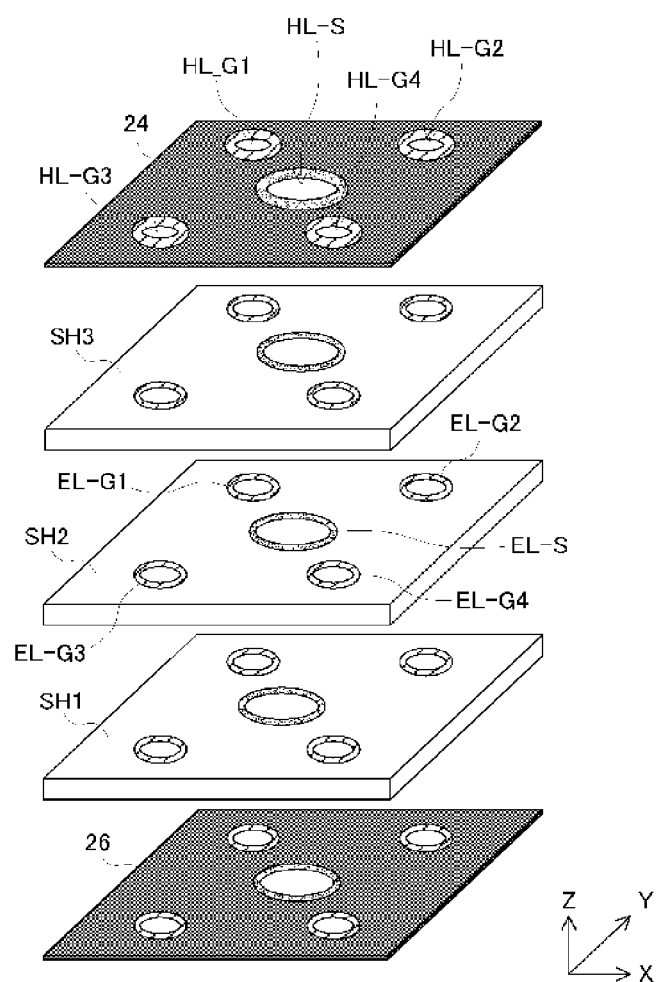
FIG. 3 is an exploded view showing a state in which the connector shown in FIG. 2 is enlarged.

Referring to FIGS. 2 and 3, a connector 20 is a fixing portion including a flexible insulator (dielectric) 22 preferably having a substantial rectangular-parallelepiped shape as an element body, and provided at the wiring substrate 10 to fix a flat cable 30. The insulator 22 is manufactured preferably by stacking three insulating sheets SH1 to SH3. The upper surface of the insulator 22 is covered with a resist layer 24, and the lower surface of the insulator 22 is covered with a resist layer 26. A through hole HL-S is provided at the center of the upper surface of the connector 20, and reaches the lower surface. Also, four through holes HL-G1 to HL-G4 are provided at positions near four corners of a rectangle defining the upper surface of the connector 20, and reach the lower surface.

Figure 4:
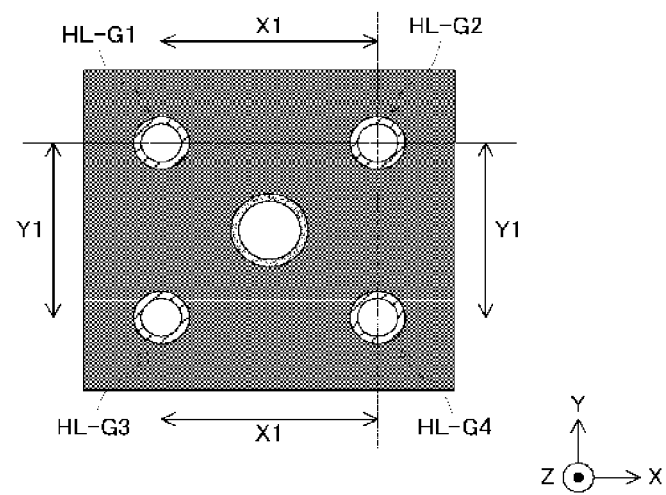
FIG. 4 is a plan view showing a state of the connector shown in FIG. 2 when viewed from the upper side.

As shown in FIG. 4, the through hole HL-G1 is provided at a corner at the negative side in the X-axis direction and the positive side in the Y-axis direction. The through hole HL-G2 is provided at a corner at the positive side in the X-axis direction and the positive side in the Y-axis direction. Also, the through hole HL-G3 is provided at a corner at the negative side in the X-axis direction and the negative side in the Y-axis direction. The through hole HL-G4 is provided at a corner at the positive side in the X-axis direction and the negative side in the Y-axis direction.

The through holes HL-G1 and HL-G2 are arranged in the X-axis direction. The through holes HL-G3 and the HL-G4 are also arranged in the X-axis direction. The distance between the through holes HL-G1 and HL-G2 and the distance between the through holes HL-G3 and HL-G4 each correspond to "X1." Also, the through holes HL-G1 and HL-G3 are arranged in the Y-axis direction. The through holes HL-G2 and the HL-G4 are also arranged in the Y-axis direction. The distance between the through holes HL-G1 and HL-G3 and the distance between the through holes HL-G2 and HL-G4 each correspond to "Y1." The inner diameters of the through holes HL-G1 to HL-G4 are equivalent, and the inner diameter of the through hole HL-S is slightly lager than the inner diameter of each of the through holes HL-G1 to HL-G4.

Referring back to FIG. 3, a conductive film EL-S is provided on the inner peripheral surface of the through hole HL-S. Also, a conductive film EL-G1 is provided on the inner peripheral surface of the through hole HL-G1, and a conductive film EL-G2 is provided on the inner peripheral surface of the through hole HL-G2. Further, a conductive film EL-G3 is provided on the inner peripheral surface of the through hole HL-G3, and a conductive film EL-G4 is provided on the inner peripheral surface of the through hole HL-G4. The through holes with the conductive films provided on the inner peripheral surfaces each function as a hole-shaped connection conductor into which a protrusion-shaped connection conductor is inserted.

Although described later, the inner diameter of any of the through holes HL-S, and HL-G1 to HL-G4 provided in the resist layers 24 and 26 is slightly larger than the inner diameter of the corresponding through hole provided in the insulator 22. The conductive films EL-S, and EL-G1 to EL-G4 partly extend to the upper surface and the lower surface of the insulator 22 by amounts of the differences in inner diameter.

Figure 5:
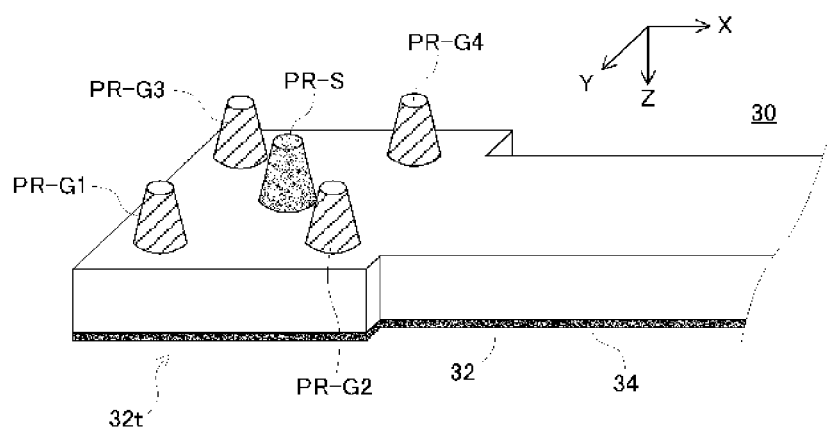
FIG. 5 is a perspective view showing a flat cable according to a preferred embodiment of the present invention.

Referring to FIG. 5, the flat cable (high-frequency transmission line) 30 preferably has a triplate-type strip-line structure, and includes a flexible sheet-shaped insulator (dielectric) 32 as an element body. The insulator 32 has a certain length in the X-direction, and the principal surfaces of the insulator 32 face the Z-axis direction. At an end portion 32t in the X-axis direction, the size of the principal surfaces of the insulator 32 is adjusted to match or substantially match the size of the principal surfaces of the connector 20. The upper surface (the principal surface facing the positive side in the Z-axis direction) of the insulator 32 is covered with a resist layer 34.

A signal protrusion-shaped connection conductor (hereinafter, referred to as signal columnar conductor) PR-S, and ground protrusion-shaped connection conductors (hereinafter, referred to as ground columnar conductors) PR-G1 to PR-G4, each preferably having a solid columnar shape (in a strict sense, solid truncated conical shape), are provided at positions corresponding to the end portion 32t on the lower surface (the principal surface facing the negative side in the Z-axis direction) of the insulator 32. The signal columnar conductor PR-S protrudes from the center of the lower surface of the end portion 32t to the negative side in the Z-axis direction. Also, the ground columnar conductors PR-G1 to PR-G4 protrude from the four corners of the lower surface of the end portion 32t to the negative side in the Z-axis direction.

The outer diameters of tip end portions of the signal columnar conductor PR-S, and the ground columnar conductors PR-G1 to PR-G4 are equivalent to or slightly smaller than the inner diameters of the through holes HL-S, and L-G1 to HL-G4. Also, the outer diameters of bottom portions of the signal columnar conductor PR-S, and the ground columnar conductors PR-G1 to PR-G4 are slightly larger than the inner diameters of the through holes HL-S, and HL-G1 to HL-G4.

Figure 7:
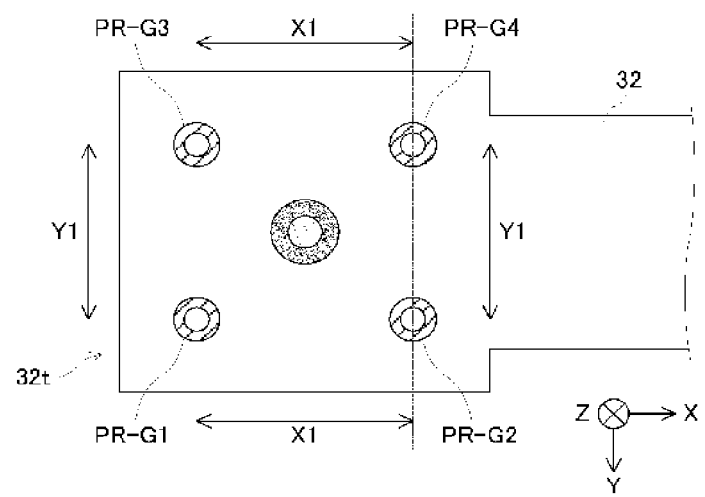
FIG. 7 is a plan view showing a state of the flat cable shown in FIG. 4 when viewed from the lower side.

As shown in FIG. 7, the ground columnar conductor PR-G1 is provided at a corner at the negative side in the X-axis direction and the positive side in the Y-axis direction. The ground columnar conductor PR-G2 is provided at a corner at the positive side in the X-axis direction and the positive side in the Y-axis direction. Also, the ground columnar conductor PR-G3 is provided at a corner at the negative side in the X-axis direction and the negative side in the Y-axis direction. The ground columnar conductor PR-G4 is provided at a corner at the positive side in the X-axis direction and the negative side in the Y-axis direction.

The ground columnar conductors PR-G1 and PR-G2 are arranged in the X-axis direction. The ground columnar conductors PR-G3 and PR-G4 are also arranged in the X-axis direction. The distance between the ground columnar conductors PR-G1 and PR-G2 and the distance between the ground columnar conductors PR-G3 and PR-G4 each correspond to "X1." The ground columnar conductors PR-G1 and PR-G3 are arranged in the Y-axis direction. The ground columnar conductors PR-G2 and PR-G4 are also arranged in the Y-axis direction. The distance between the ground columnar conductors PR-G1 and PR-G3 and the distance between the ground columnar conductors PR-G2 and PR-G4 each correspond to "Y1."

The dimensions of the ground columnar conductors PR-G1 to PR-G4 are equivalent. In contrast, although the height of the ground columnar conductor PR-S is equivalent to the height of each of the ground columnar conductors PR-G1 to PR-G4, at the same height position, the outer diameter of the ground columnar conductor PR-S is slightly larger than the outer diameter of each of the ground columnar conductors PR-G1 to PR-G4.

Figure 6:
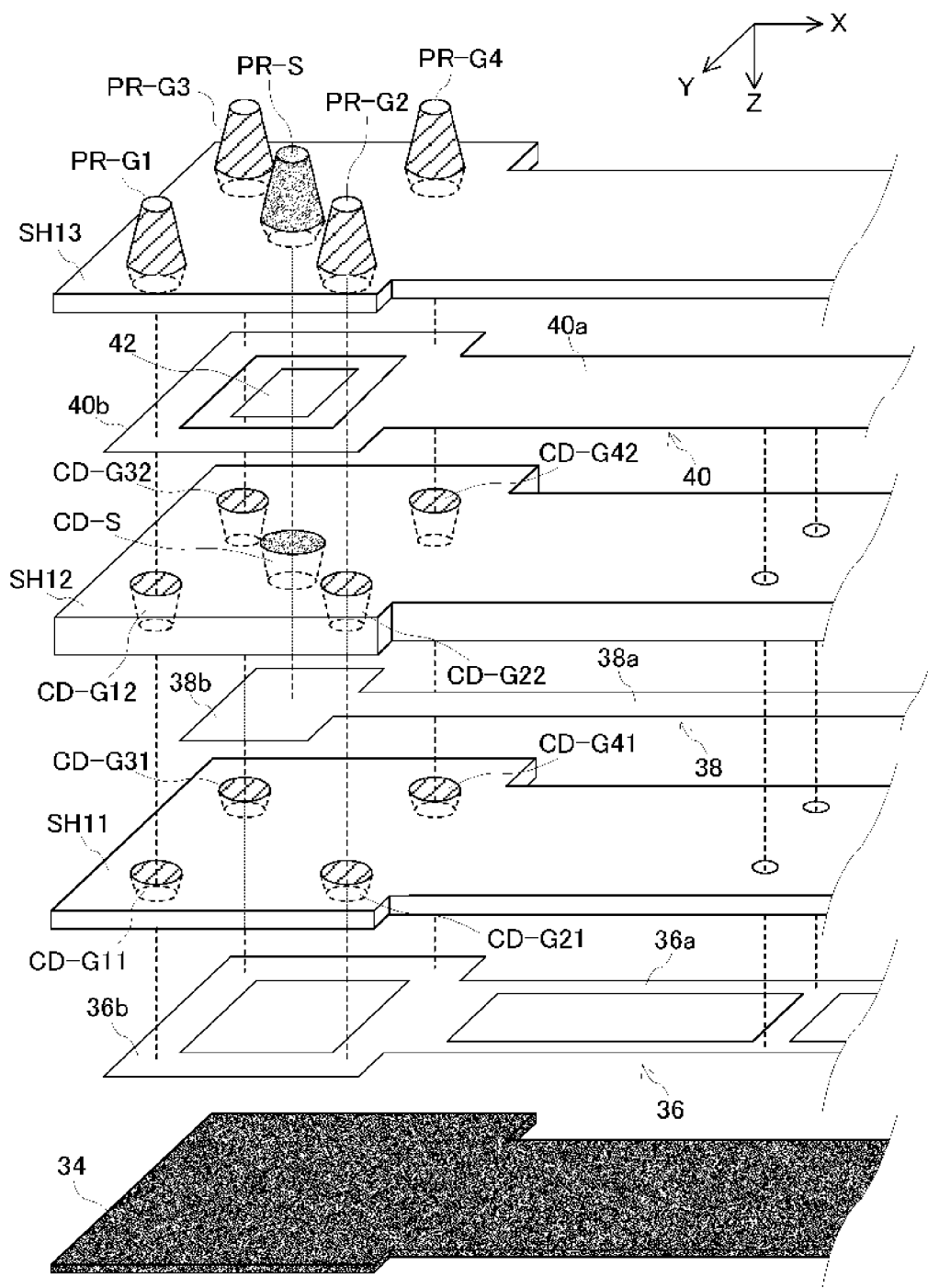
FIG. 6 is an exploded view showing a state in which the flat cable shown in FIG. 4 is exploded.

FIG. 6 shows an exploded view of the flat cable 30. The insulator 32 is manufactured by stacking the resist layer 34 and flexible insulating sheets (dielectric sheets) SH11 to SH13. The insulating sheets SH11 to SH13 each use a thermoplastic resin sheet of, for example, liquid crystal polymer or polyimide. The thermoplastic resin sheet is elastic and flexible, and preferably is integrated by pressing and heating without an adhesive layer such as epoxy resin. The resist layer 34 and the insulating sheets SH11 to SH13 preferably include principal surfaces of a common size. Portions around end portions of the respective principal surfaces of the resist layer 34 and the insulating sheets SH11 to SH13 have substantially T-shaped configurations when viewed in the Z-axis direction.

Ground columnar conductors CD-G11, CD-G21, CD-G31, and CD-G41 are embedded in the insulating sheet SH11, and a ground layer 36 is provided on the lower surface of the insulating sheet SH11. Also, ground columnar conductors CD-G12, CD-G22, CD-G32, and CD-G42, and a signal columnar conductor CD-S are embedded in the insulating sheet SH12, and a plate-shaped transmission conductor 38 configured to transmit a high-frequency signal is provided on the lower surface of the insulating sheet SH12. Further, the above-described signal columnar conductors PR-S, and the ground columnar conductors PR-G1 to PR-G4 are provided on the insulating sheet SH13, and a ground layer 40 and a reinforcement layer 42 are provided on the lower surface of the insulating sheet SH13.

The ground layer 36, the transmission conductor 38, the ground layer 40, and the reinforcement layer 42 preferably are formed by patterning, for example, etching a metal layer, such as copper foil, provided on the principal surfaces of the insulating sheets SH11 to SH13.

When the insulating sheet SH11 is viewed in the Z-axis direction, the ground columnar conductor CD-G11 is embedded at a position that is overlaid with the ground columnar conductor PR-G1, the ground columnar conductor CD-G21 is embedded at a position that is overlaid with the ground columnar conductor PR-G2, the ground columnar conductor CD-G31 is embedded at a position that is overlaid with the ground columnar conductor PR-G3, and the ground columnar conductor CD-G41 is embedded at a position that is overlaid with the ground columnar conductor PR-G4.

The ground layer 36 provided on the lower surface of the insulating sheet SH11 is integrally configured of a plate-shaped ground conductor 36a defining a ladder when viewed in the Z-axis direction, and a plate-shaped ground conductor 36b defining a rectangular or substantially rectangular ring when viewed in the Z-axis direction. The ground conductor 36a extends in the X-axis direction, and the ground conductor 36b is provided at an end portion in the X-axis direction. When viewed in the Z-axis direction, the rectangular or substantially rectangular ring forming the ground conductor 36b is overlaid with the ground columnar conductors CD-G11, CD-G21, CD-G31, and CD-G41.

When the insulating sheet SH12 is viewed in the Z-axis direction, the ground columnar conductor CD-G12 is embedded at a position that is overlaid with the ground columnar conductor PR-G1, the ground columnar conductor CD-G22 is embedded at a position that is overlaid with the ground columnar conductor PR-G2, the ground columnar conductor CD-G32 is embedded at a position that is overlaid with the ground columnar conductor PR-G3, and the ground columnar conductor CD-G42 is embedded at a position that is overlaid with the ground columnar conductor PR-G4. Also, the signal columnar conductor CD-S is embedded at a position that is overlaid with the signal columnar conductor PR-S.

The transmission conductor 38 provided on the lower surface of the insulating sheet SH12 is integrally configured of a strip-shaped conductor 38a defining an elongated strip when viewed in the Z-axis direction, and a reinforcement conductor 38b defining a rectangle when viewed in the Z-axis direction. The strip-shaped conductor 38a has a smaller width than the width of the ground conductor 36a, and extends in the X-axis direction. The reinforcement conductor 38b is provided at an end portion in the X-axis direction. When viewed in the Z-axis direction, the reinforcement conductor 38b is located at the inner side of the rectangular or substantially rectangular ring forming the ground conductor 36b, and is overlaid with the signal columnar conductor PR-S.

The ground layer 40 provided on the lower surface of the insulating sheet SH13 is integrally configured of a ground conductor 40a defining an elongated strip when viewed in the Z-axis direction, and a plate-shaped ground conductor 40b defining a rectangular or substantially rectangular ring when viewed in the Z-axis direction. The ground conductor 40a preferably has the same width as the width of the ground conductor 36a, and extends in the X-axis direction. A ground conductor 40b is provided at an end portion in the X-axis direction. When viewed in the Z-direction, the ground conductor 40b is overlaid with the ground conductor 36b. Also, the reinforcement layer 42 is provided at the inner side of the rectangular or substantially rectangular ring defining the ground conductor 40b. When viewed in the Z-axis direction, the reinforcement layer 42 is overlaid with the signal columnar conductor PR-S.

Hence, the transmission conductor 38 is connected with the signal columnar conductor PR-S through the signal columnar conductor CD-S and the reinforcement layer 42. Also, the ground layer 36 is connected with the ground columnar conductors PR-G1 to PR-G4 through the ground columnar conductors CD-G11 to CD-G41, CD-G12 to CD-G42, and the ground layer 40. Also, the ground conductors 40a and 36a are connected with each other through via hole conductors (not shown) uniformly spaced in the X-axis direction and extending in the Z-axis direction.

Figure 8:
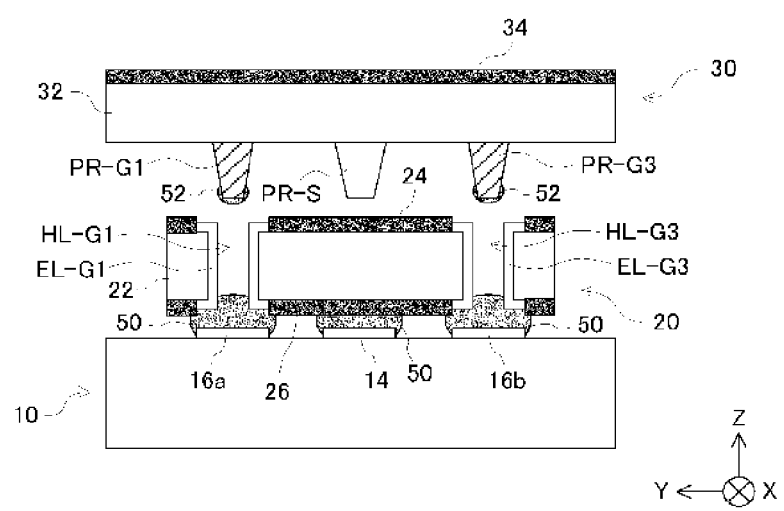
FIG. 8 is an explanatory view showing a portion of a step of fixing the flat cable to the connector mounted on the wiring substrate.

Referring to FIG. 8, the connector 20 is mounted on the wiring substrate 10 at a position at which a lower-surface-side end portion of the through hole HL-S faces the signal terminal 14, lower-surface-side end portions of the through holes HL-G1 and HL-G2 face the ground terminal 16a, and lower-surface-side end portions of the through holes HL-G3 and HL-G4 face the ground terminal 16b. The mutually facing through holes and terminals are coupled by a conductive joining material 50 such as solder paste, and are electrically connected. The connector 20 is fixed to the wiring substrate 10 in this way.

When the flat cable 30 is connected with the connector 20, the signal columnar conductor PR-S is inserted into the through hole HL-S, and the ground columnar conductors PR-G1 to PR-G4 are respectively inserted into the through holes HL-G1 to HL-G4. A conductive joining material 52 is printed on each of tip ends of the signal columnar conductor PR-S and the ground columnar conductors PR-G1 to PR-G4, and the conductive joining material 52 is molten by heat processing after insertion. The mutually facing conductors and through holes are electrically connected through the molten conductive joining material 52.

The signal columnar conductor PR-S, and the ground columnar conductors PR-G1 to PR-G4 are harder than the insulator 22 defining the connector 20. When the signal columnar conductor PR-S, and the ground columnar conductors PR-G1 to PR-G4 are stuck to the through holes HL-S, and HL-G1 to HL-G4, the through holes HL-S, and HL-G1 to HL-G4 are deformed in accordance with the shapes of the signal columnar conductor PR-S, and the ground columnar conductors PR-G1 to PR-G4. Accordingly, the signal columnar conductor PR-S and the ground columnar conductors PR-G1 to PR-G4 are connected with the through holes HL-S, and HL-G1 to HL-G4 while a strong and good electrical connection state is held.

Also, since the signal columnar conductor PR-S and the ground columnar conductors PR-G1 to PR-G4 preferably have truncated conical shapes, the signal columnar conductor PR-S and the ground columnar conductors PR-G1 to PR-G4 are easily respectively stuck to the through holes HL-S, and HL-G1 to HL-G4. Alternatively, instead of the signal columnar conductor PR-S, and the ground columnar conductors PR-G1 to PR-G4, the inner peripheral surfaces of the through holes HL-S, and L-G1 to HL-G4 preferably are tapered.

With regard to the above description, the conductive joining material 52 does not have to be provided. In some cases, the flat cable 30 may be fixed to the connector 20 by using a nonconductive adhesive or pins.

Figure 9A:
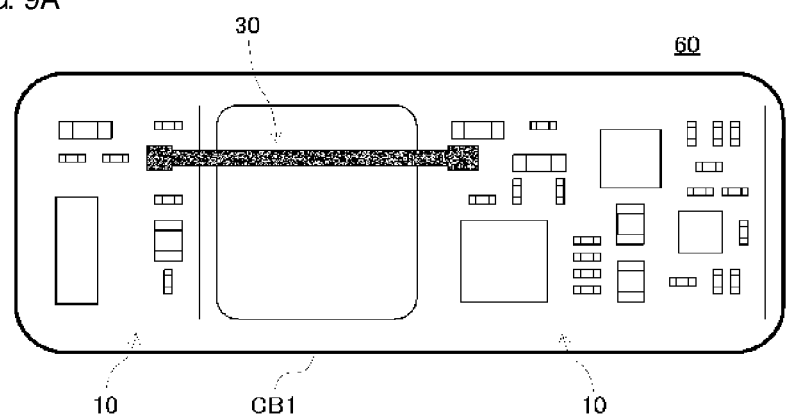
FIG. 9A is a top view showing an example of a mobile communication terminal housing the flat cable, the connector, and the wiring substrate according to a preferred embodiment of the present invention.
Figure 9B:
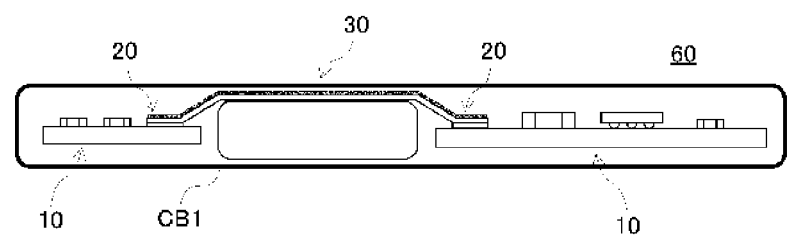
FIG. 9B is a cross-sectional view of a primary portion of the communication terminal shown in FIG. 9A.

As shown in FIG. 9A to FIG. 9B, the wiring substrate having the connector 20 mounted thereon is housed in, for example, a housing CB1 of a mobile communication terminal 60. The flat cable 30 is mounted on the wiring substrate 10 in the manner described above. Accordingly, circuits and elements mounted on the wiring substrate 10 are connected with each other through the flat cable 30. The flat cable 30 is thin and flexible, and hence is particularly useful if only a thin gap can be provided in the housing CB1.

The connector 20 is manufactured in a manner shown in FIG. 10A to FIG. 10E. First, three insulating sheets SH1 to SH3 having the common size are stacked (see FIG. 10A). The insulating sheets SH1 to SH3 preferably are thermoplastic resin sheets made of, for example, liquid crystal polymer or polyimide. Since the thermoplastic resin sheet is elastic and flexible, the insulating sheets SH1 to SH3 are preferably bonded and integrated by pressing and heating the insulating sheets SH1 to SH3 without using an adhesive layer such as epoxy resin.

Figure 10A:
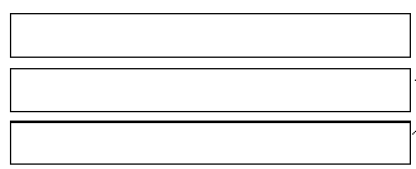
FIG. 10A is an explanatory view showing a portion of a manufacturing step of the connector shown in FIG. 2.
Figure 10D:
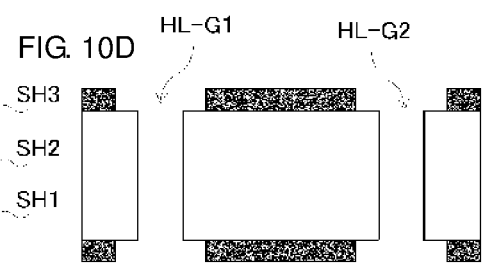
FIG. 10D is an explanatory view showing yet another portion of the manufacturing step of the connector shown in FIG. 2.
Figure 10B:
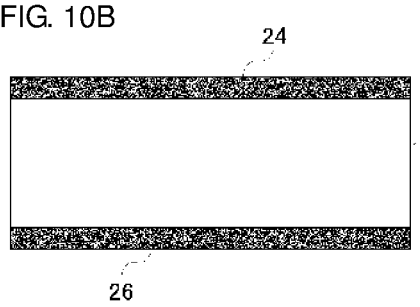
FIG. 10B is an explanatory view showing another portion of the manufacturing step of the connector shown in FIG. 2.
Figure 10E:
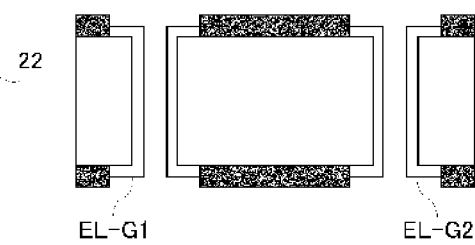
FIG. 10E is an explanatory view showing a further portion of the manufacturing step of the connector shown in FIG. 2.
Figure 10C:
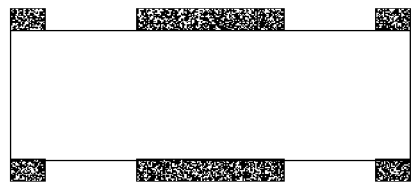
FIG. 10C is an explanatory view showing still another portion of the manufacturing step of the connector shown in FIG. 2.
Figure 10C:
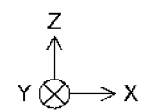

The resist layers 24 and 26 are provided on the upper surface and the lower surface of the thus manufactured insulator (see FIG. 10(B)). Then, the resist layers 24 and 26 are etched at positions at which the through holes HL-S, and HL-G1 to HL-G4 should be formed, and the insulator 22 is partly exposed at the upper surface and the lower surface (see FIG. 10C). Next, the through holes HL-S, and HL-G1 to HL-G4 are formed by laser irradiation or the like (see FIG. 10D), and then the conductive films EL-S, and EL-G1 to EL-G4 are formed on the inner peripheral surfaces and the peripheries of the end portions of the through holes HL-S, and HL-G1 to HL-G4 by plating.

Figure 11A:
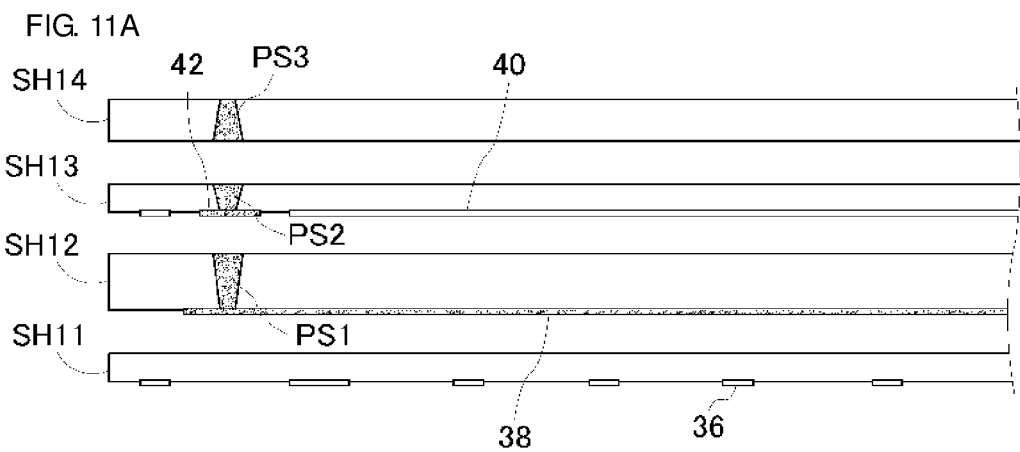
FIG. 11A is an explanatory view showing a portion of a manufacturing step of the flat cable shown in FIG. 5.
Figure 11B:
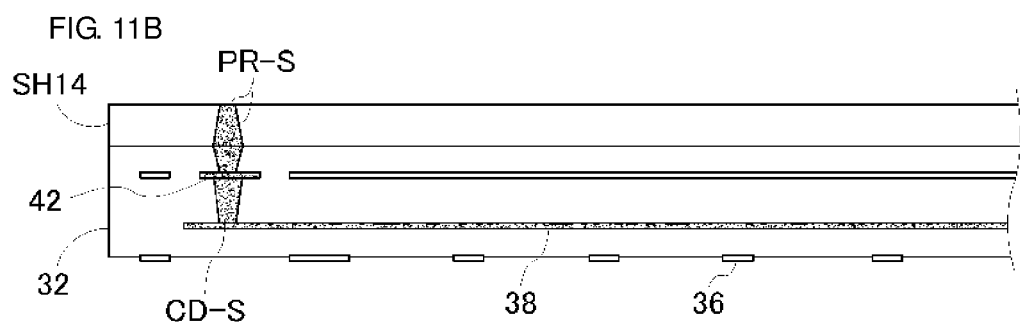
FIG. 11B is an explanatory view showing another portion of the manufacturing step of the flat cable shown in FIG. 5.
Figure 11C:
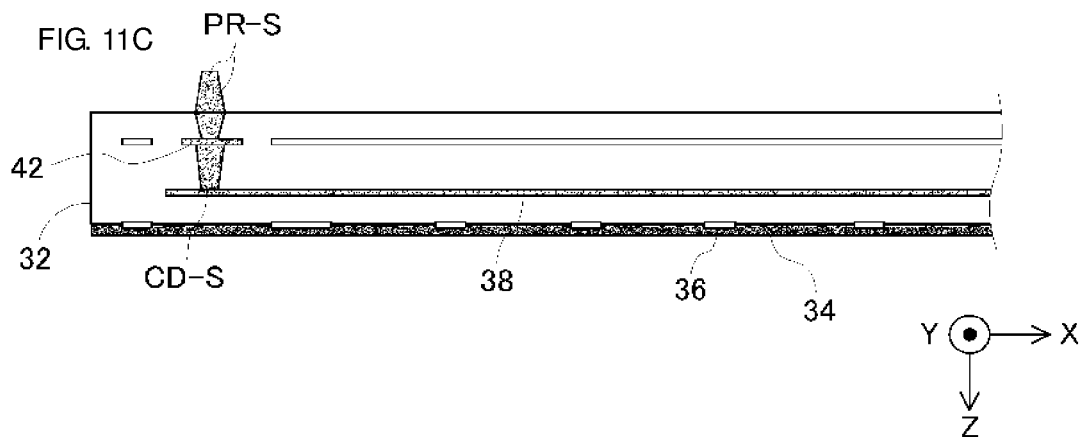
FIG. 11C is an explanatory view showing still another portion of the manufacturing step of the flat cable shown in FIG. 5.

The flat cable 30 is preferably manufactured in a manner shown in FIG. 11A to FIG. 11C. First, the ground layer 36 is formed by patterning, for example, etching copper foil formed on the insulating sheet SH11, four holes are formed in the insulating sheet SH11 at positions corresponding to the positions of the ground columnar conductors CD-G11 to CD-G41, and the four holes are filled with conductive paste (not shown) in which copper powder is dispersed (see FIG. 11A).

Also, the transmission conductor 38 is formed by patterning, for example, etching copper foil formed on the insulating sheet SH12, five holes are formed in the insulating sheet SH12 at positions corresponding to the positions of the signal columnar conductor CD-S, and the ground columnar conductors CD-G12 to CD-G42, and the five holes are filled with conductive paste PS1 in which copper powder is dispersed (see FIG. 11A).

Further, the ground layer 40 and the reinforcement layer 42 are formed by patterning, for example, etching copper foil formed on the insulating sheet SH13, five holes are formed in the insulating sheet SH13 at positions corresponding to the positions of the signal columnar conductor PR-S, and the ground columnar conductors PR-G1 to PR-G4, and the five holes are filled with conductive paste PS2 in which copper powder is dispersed (see FIG. 11A).

Also, five holes are formed in an auxiliary sheet SH14 at positions corresponding to the positions of the signal columnar conductor PR-S, and the ground columnar conductors PR-G1 to PR-G4, and the five holes are filled with conductive paste PS3 in which copper powder is dispersed (see FIG. 11A). The five holes penetrate from the lower surface to the upper surface, and the conductive paste PS3 is applied from the lower surface. This work is executed while the lower surface of the auxiliary sheet SH14 faces the upper side.

The metal powder contained in the conductive paste PS1 to the conductive paste PS3 and the not-illustrated conductive paste has the same composition, and uses copper powder or silver powder.

Next, the insulating sheets SH11 to SH13, and the auxiliary sheet SH14 are stacked in that order, and a multilayer body thus obtained is pressed and heated (see FIG. 11B). Accordingly, the insulating sheets SH11 to SH13 are bonded and integrated, and hence the insulator 22 is manufactured. Also, the metal powder contained in the conductive paste filled in other holes in the manner as described above and the metal powder contained in the conductive paste PS1 to the conductive paste PS3 are metallized by sintering, and hence the signal columnar conductors PR-S and CD-S, and the ground columnar conductors PR-G1 to PR-G4, CD-G11 to CD-G41, and CD-G12 to CD-G42 are manufactured.

In this phase, the auxiliary sheet SH14 is not integrated with the insulating sheet SH13. If thermoplastic resin sheets, which are integrated at about 300° C., for example, liquid crystal polymer or polyimide, are used as the insulating sheets SH11 to SH13, a fluorocarbon resin sheet may be used as the auxiliary sheet SH14. The material of the fluorocarbon resin sheet may be, for example, polytetrafluoroethylene (PTFE), a PTFE-perfluoroalkylvinylether copolymer, a PTFE-hexafluoropropylene copolymer, a PTFE-ethylene copolymer, etc. Alternatively, the auxiliary sheet SH14 may use other material unless the auxiliary sheet SH14 is bonded and integrated with the insulating sheets SH11 to SH13 during pressing and heating.

When thermal compression bonding is completed, the auxiliary sheet SH14 is separated, and the resist layer 34 is formed on the lower surface of the insulator 32 (see FIG. 11C). When the auxiliary sheet SH14 is separated, the signal columnar conductor PR-S and the ground columnar conductors PR-G1 to PR-G4 appear at the upper surface of the insulator 32. Preferably, processing such as plating is executed in this state. If the plated film is formed on the surfaces of the signal columnar conductor PR-S and the ground columnar conductors PR-G1 to PR-G4, the surfaces are smoothened, and the intensity of the protrusion conductors is increased.

The signal columnar conductor PR-S and the ground columnar conductors PR-G1 to PR-G4 preferably are formed in truncated conical shapes. When a hole is formed in the auxiliary sheet SH14 by laser irradiation, the side surface of the hole may be tapered by adjusting the intensity of the laser. By using the tapered side surface, the truncated conical shape preferably is formed. The diameter at the bottom-surface side of each conductor is adjusted in a range from about 200 µm to about 500 µm, the diameter at the upper-surface side of each conductor is adjusted in a range from about 100 µm to about 300 µm, and the height of each conductor is adjusted in a range from about 25 µm to about 1 mm, for example. The height of each conductor depends on the thickness of the auxiliary sheet SH14.

As described above, the signal columnar conductor PR-S protruding from the insulator 32 is integrated with the signal columnar conductor CD-S embedded in the insulator 32. The ground columnar conductors PR-G1 to PR-G4 protruding from the insulator 32 are integrated with the signal columnar conductors CD-G11 to CD-G41, and the CD-G12 to CD-G42 embedded in the insulator 32. Hence, the signal columnar conductor PR-S and the ground columnar conductors PR-G1 to PR-G4 are hardly dropped from the insulator 32, and the intensity is increased.

To increase the intensity, a reinforcement sheet member, such as a SUS plate, may be preferably provided on the upper surface (the principal surface facing the positive side in the Z-axis direction) of the end portion 32t. With this configuration, the intensity of the end portion 32t is increased while flexibility of a line portion is held. To increase the intensity of the end portion 32t, the conductor density of the end portion 32t is increased.

Figure 12:
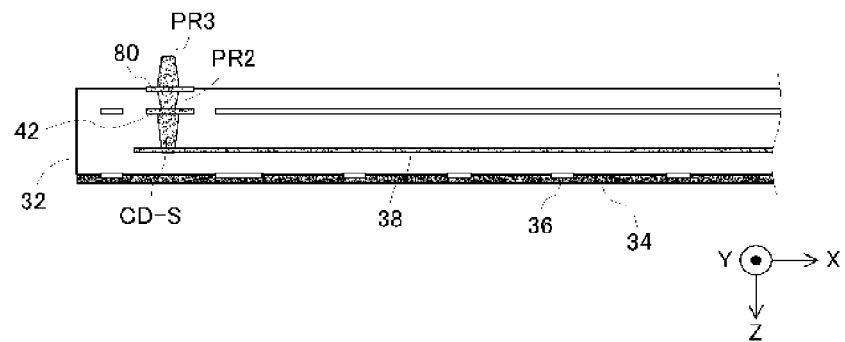
FIG. 12 is an explanatory view showing a structure of a flat cable according to another preferred embodiment of the present invention.

Also, referring to FIG. 11A to FIG. 11C, the signal columnar conductor PR-S and the ground columnar conductors PR-G1 to PR-G4 are preferably formed by metalizing the conductive paste PS2 and PS3. To increase the intensities of the signal columnar conductor PR-S and the ground columnar conductors PR-G1 to PR-G4, the conductive paste PS2 and the conductive paste PS3 preferably are metallized while the conductive paste PS2 and the conductive paste PS3 sandwich a reinforcement layer 80 as shown in FIG. 12.

As it is understood from the above description, the flat cable 30 includes the insulator 32 as a base member, the elongated transmission conductor 38, and the ground layers 36 and 40. The connector 20 is provided on the wiring substrate 10 to fix the flat cable 30. The flat cable 30 includes the signal columnar conductors PR-S and CD-S integrated with the transmission conductor 38 and formed in solid columnar shapes, and further includes the ground columnar conductors PR-G1 to PR-G4, CD-G11 to CD-G41, and CD-G12 to CD-G42 integrated with the ground layers 36 and 40 and formed in solid columnar shapes. The connector 20 includes the through hole HL-S having a shape corresponding to the shape of the signal columnar conductor PR-S, and the through holes HL-G1 to HL-G4 having shapes corresponding to the shapes of the ground columnar conductors PR-G1 to PR-G4. The conductive film EL-S is formed on the inner peripheral surface of the through hole HL-S, and the conductive films EL-G1 to EL-G4 are formed on the inner peripheral surfaces of the through holes HL-G1 to HL-G4. The signal columnar conductor PR-S is inserted into the through hole HL-S, and the ground columnar conductors PR-G1 to PR-G4 are inserted into the through holes HL-G1 to HL-G4. Accordingly, an easy and reliable fixing structure is provided.

Alternatively, the flat cable 30 may be manufactured in a manner shown in FIG. 13A to FIG. 13D. First, the four holes formed in the insulating sheet SH11 at the positions corresponding to the positions of the ground columnar conductors CD-G11 to CD-G41 are filled with the conductive material (not shown), and the ground layer 36 is formed on the lower surface of the insulating sheet SH11 (see FIG. 13A).

Figure 13A:
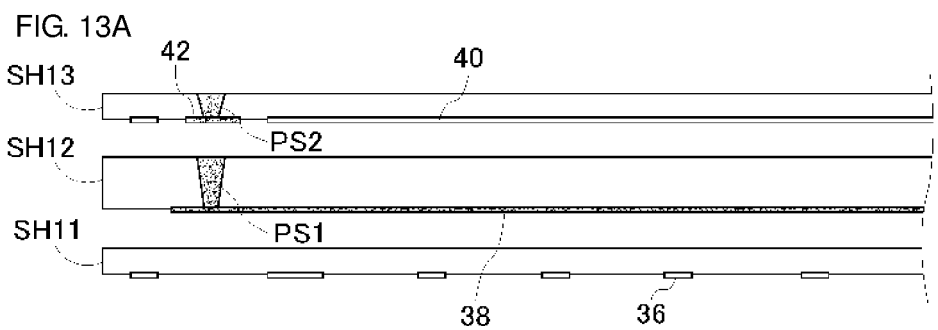
FIG. 13A is an explanatory view showing a portion of a manufacturing step of the flat cable according to another preferred embodiment of the present invention.

Also, the five holes formed in the insulating sheet SH12 at the positions corresponding to the positions of the signal columnar conductor CD-S and the ground columnar conductors CD-G12 to CD-G42 are filled with the conductive material PS1, and the transmission conductor 38 is formed on the lower surface of the insulating sheet SH12 (see FIG. 13A).

Further, the five holes formed in the insulating sheet SH13 at the positions corresponding to the positions of the signal columnar conductor PR-S and the ground columnar conductors PR-G1 to PR-G4 are filled with the conductive material PS2, and the ground layer 40 and the reinforcement layer 42 are formed on the lower surface of the insulating sheet SH13 (see FIG. 13A).

Figure 13B:
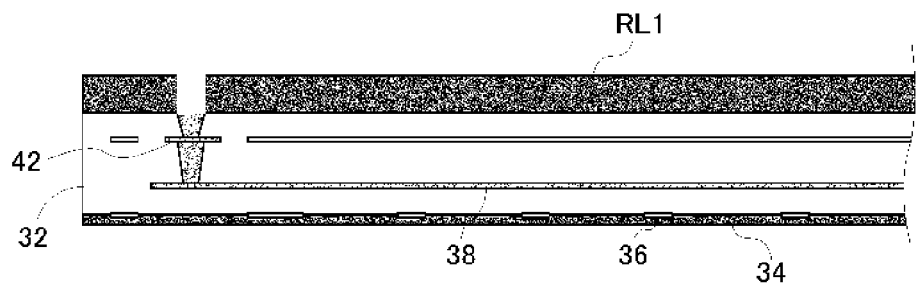
FIG. 13B is an explanatory view showing another portion of the manufacturing step of the flat cable according to the another preferred embodiment.

Next, the insulating sheets SH11 to SH13 are stacked in that order and bonded by thermal compression bonding, and a resist layer RL1 and the resist layer 34 are formed on the upper surface and the lower surface of the insulator 32 thus manufactured (see FIG. 13B). As a result of the thermal compression bonding, the not-illustrated conductive material and the conductive paste PS1 to PS2 filled in the above-described manner are metallized, and part of the signal columnar conductor PR-S, part of the ground columnar conductors PR-G1 to PR-G4, the signal columnar conductor CD-S, and the ground columnar conductors CD-G11 to CD-G41, and CD-G12 to CD-G42 are formed. Also, the resist layer RL1 is etched to correspond to the positions of the signal columnar conductor PR-S, and the ground columnar conductors PR-G1 to PR-G4.

Figure 13C:
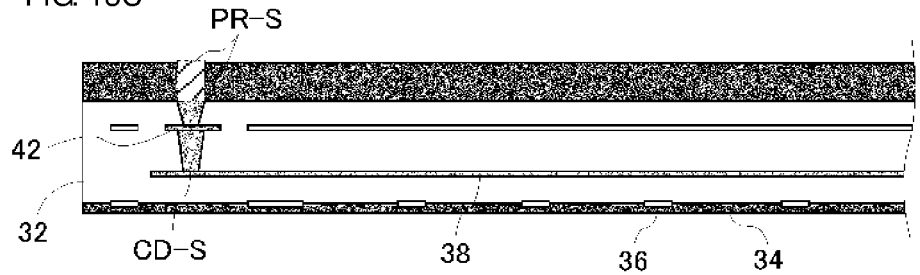
FIG. 13C is an explanatory view showing still another portion of the manufacturing step of the flat cable according to the another preferred embodiment.
Figure 13D:
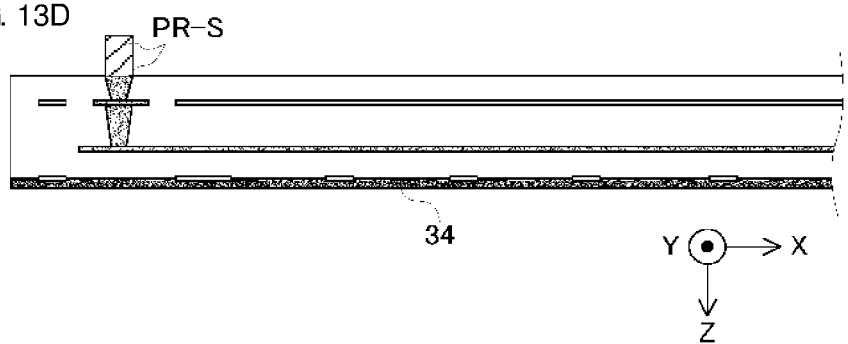
FIG. 13D is an explanatory view showing still another portion of the manufacturing step of the flat cable.

Next, plating is grown at the etched positions, and the other portion of the signal columnar conductor PR-S and the other part of the ground columnar conductors PR-G1 to PR-G4 are formed (see FIG. 13C). When the plating growth is completed, the resist layer RL1 is removed (see FIG. 13D), and hence the flat cable 30 is completed.

Also, in the above-described preferred embodiment, the through holes HL-S, and HL-G1 to HL-G4 are formed in the connector 20, and the columnar conductors PR-S, and PR-G1 to PR-G4 of the solid columnar shapes are formed on the flat cable 30. Alternatively, in the manner shown in FIGS. 14 to 15, through holes HL-S, and HL-G1 to HL-G2 may be formed in a flat cable 30A, and columnar conductors PR-S, and PR-G1 to PR-G2 having solid columnar shapes may be formed on a connector 20A. Hereinafter, the flat cable 30A and the connector 20A according to this preferred embodiment are described with reference to FIGS. 14 and 15. The same reference signs are applied to components similar to those of the flat cable 30 and the connector 20, and the detailed description is omitted.

Figure 14:
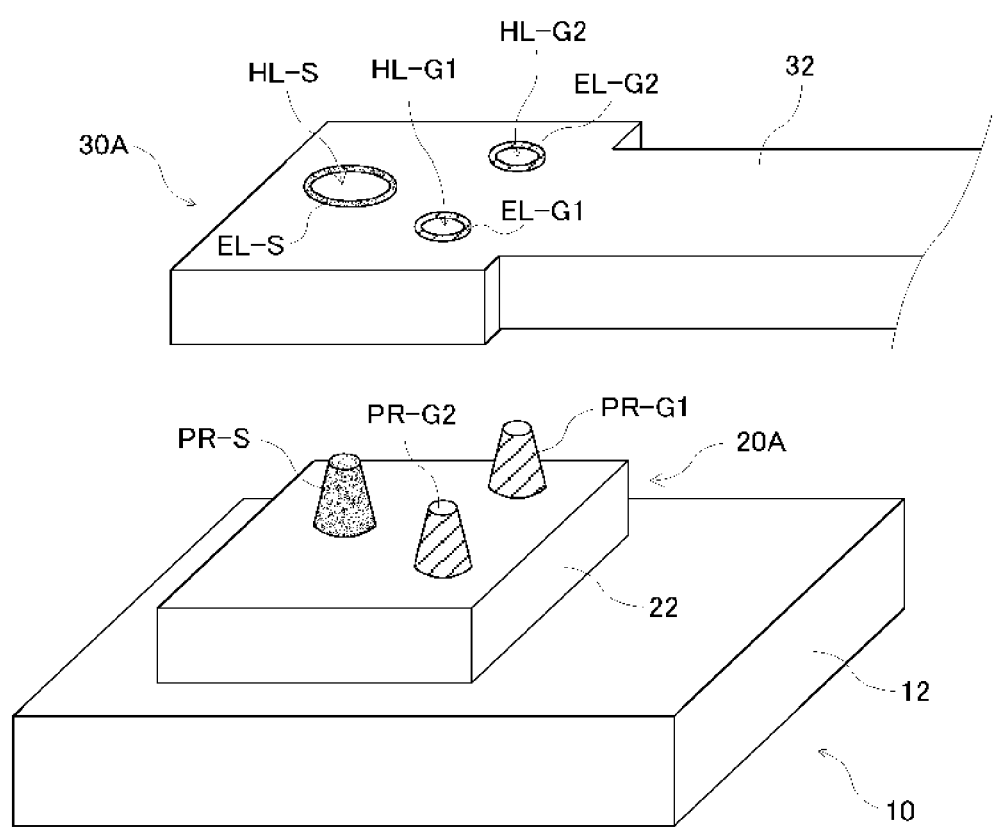
FIG. 14 is a perspective view showing a step of mounting a flat cable and a connector onto a wiring substrate according to still another preferred embodiment of the present invention.

Referring to FIG. 14, the signal columnar conductor PR-S preferably protrudes to the upper side from the position at the negative side in the X-axis direction with respect to the center of the upper surface of the connector 20A. Also, the ground columnar conductor PR-G1 preferably protrudes to the upper side from a corner at the positive side in the X-axis direction and the positive side in the Y-axis direction of the upper surface of the connector 20A. The ground columnar conductor PR-G2 preferably protrudes to the upper side from a corner at the positive side in the X-axis direction and the negative side in the Y-axis direction of the upper surface of the connector 20A.

In contrast, the through hole HL-S is provided at a position at the negative side in the X-axis direction with respect to the center of the principal surface of the end portion 32t. Also, the through hole HL-G1 is provided at a corner at the positive side in the X-axis direction and the positive side in the Y-axis direction of the principal surface of the end portion 32t. The through hole HL-G2 is provided at a corner at the positive side in the X-axis direction and the negative side in the Y-axis direction in the principal surface of the end portion 32t. The conductive film EL-S is provided on the inner peripheral surface of the through hole HL-S, and the conductive films EL-G1 to EL-G2 are respectively provided on the inner peripheral surfaces of the through holes HL-G1 to HL-G2. The through holes with the conductive films provided on the inner peripheral surfaces each define and function as a hole-shaped connection conductor into which a protrusion-shaped connection conductor is inserted.

Figure 15:
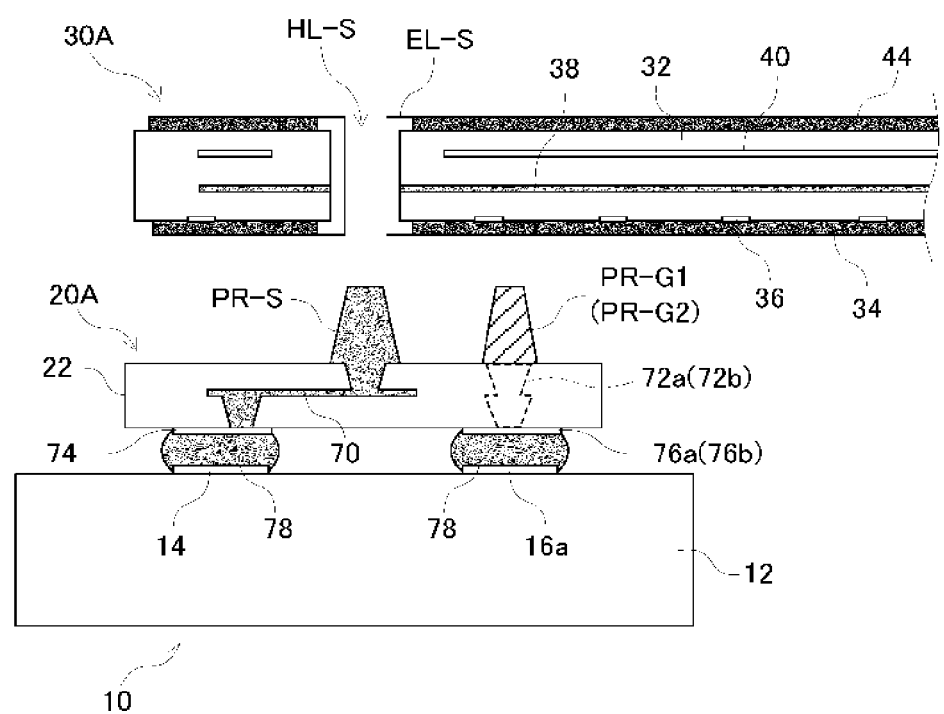
FIG. 15 is a cross-sectional view of a primary portion showing the mounting step shown in FIG. 14.

As shown in FIG. 15, the signal columnar conductor PR-S is integrated with a connection conductor 70, the ground columnar conductor PR-G1 is integrated with a connection conductor 72a, and the ground columnar conductor PR-G2 is integrated with a connection conductor 72b. Also, a signal terminal 74 and ground terminals 76a and 76b are provided on the lower surface of the insulator 22. A signal terminal 74 is electrically connected with the connection conductor 70, the ground terminals 76a and 76b are respectively electrically connected with the connection conductors 72a and 72b.

Further, the signal terminal 74 is electrically connected with the signal terminal 14 of the wiring substrate 10 through a conductive joining material 78, and the ground terminals 76a and 76b are electrically connected with the ground terminals 16a and 16b of the wiring substrate 10 through the conductive joining material 78.

In the flat cable 30A, the through hole HL-S further penetrates through the transmission conductor 38, and the through holes HL-G1 and HL-G2 each further penetrate through the ground layers 36 and 40. Accordingly, the transmission conductor 38 is electrically connected with the conductor film EL-S, and the ground layers 36 and 40 are electrically connected with each of the conductive films EL-G1 and EL-G2.

Also, in the flat cable 30, the single signal columnar conductor PR-S is provided on the lower surface (the principal surface facing the negative side in the Z-axis direction) of the insulating sheet SH13, the single signal columnar conductor CD-S electrically connected with the signal columnar conductor PR-S is embedded in the insulating sheet SH12, and the single transmission conductor 38 electrically connected with the signal columnar conductor CD-S is provided on the upper surface (the principal surface facing the positive side in the Z-axis direction) of the insulating sheet SH12 (see FIG. 6).

Figure 16:
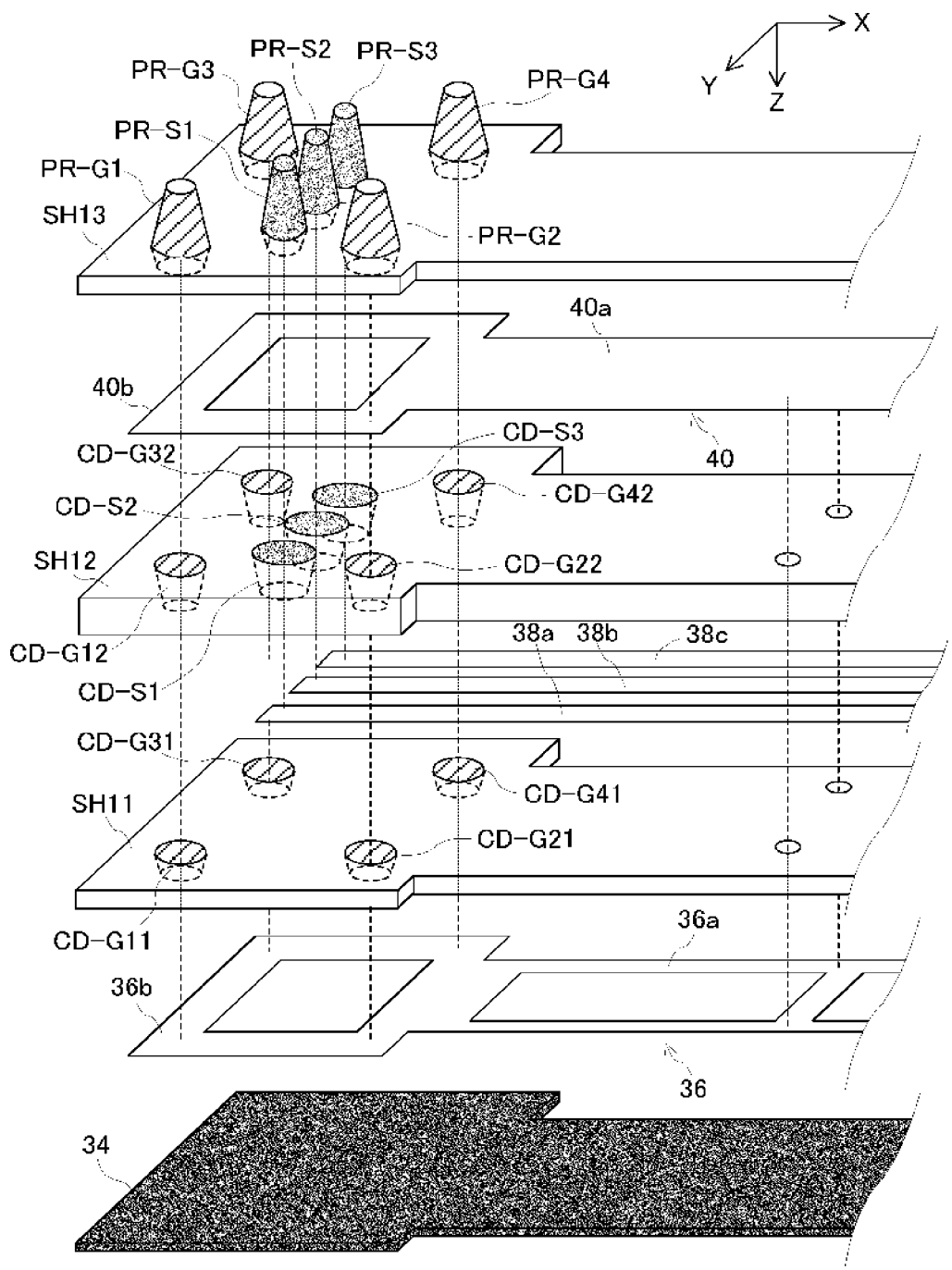
FIG. 16 is an exploded view showing a state in which the flat cable according to another preferred embodiment of the present invention is enlarged.

In contrast, like a flat cable 30B shown in FIG. 16, a plurality of signal columnar conductors PR-S1 to PR-S3 may be provided on the lower surface of the insulating sheet SH13 instead of the signal columnar conductor PR-S of the flat cable 30, a plurality of signal columnar conductors CD-S1 to CD-S3 which are respectively connected with the plurality of signal columnar conductors PR-S1 to PR-S3 may be embedded in the insulating sheet SH12 instead of the signal columnar conductor CD-S, and a plurality of transmission conductors 38a to 38c which are respectively connected with the signal columnar conductors CD-S1 to CD-S3 may be formed on the upper surface of the insulating sheet SH12 instead of the transmission conductor 38. Hereinafter, the flat cable 30B and a connector 20B according to this preferred embodiment are described with reference to FIGS. 16 and 17. The same reference signs are applied to components similar to those of the flat cable 30 and the connector 20, and the detailed description is omitted.

Referring to FIG. 16, the signal columnar conductor PR-S2 protrudes from the center of the lower surface of an end portion of the flat cable 30B to the negative side in the Z-axis direction. Also, the signal columnar conductor PR-S1 protrudes from a position at the positive side in the Y-axis direction with respect to the signal columnar conductor PR-S2 to the negative side in the Z-axis direction. The signal columnar conductor PR-S3 protrudes from a position at the negative side in the Y-axis direction with respect to the signal columnar conductor PR-S2 to the negative side in the Z-axis direction.

Also, the signal columnar conductor CD-S1 is embedded at a position that is overlaid with the signal columnar conductor PR-S1 when viewed in the Z-axis direction. The signal columnar conductor CD-S2 is embedded at a position that is overlaid with the signal columnar conductor PR-S2 when viewed in the Z-axis direction. The signal columnar conductor CD-S3 is embedded at a position that is overlaid with the signal columnar conductor PR-S3 when viewed in the Z-axis direction.

Further, transmission conductors 38a to 38c are arranged in the positive Y-axis direction in the order of 38c, 38b, and 38a. An end portion of the transmission conductor 38a is overlaid with the signal columnar conductor CD-S1 when viewed in the Z-axis direction. An end portion of the transmission conductor 38b is overlaid with the signal columnar conductor CD-S2 when viewed in the Z-axis direction. An end portion of the transmission conductor 38c is overlaid with the signal columnar conductor CD-S3 when viewed in the Z-axis direction. In the flat cable 30B shown in FIG. 16, the reinforcement layer 42 is omitted.

Figure 17:
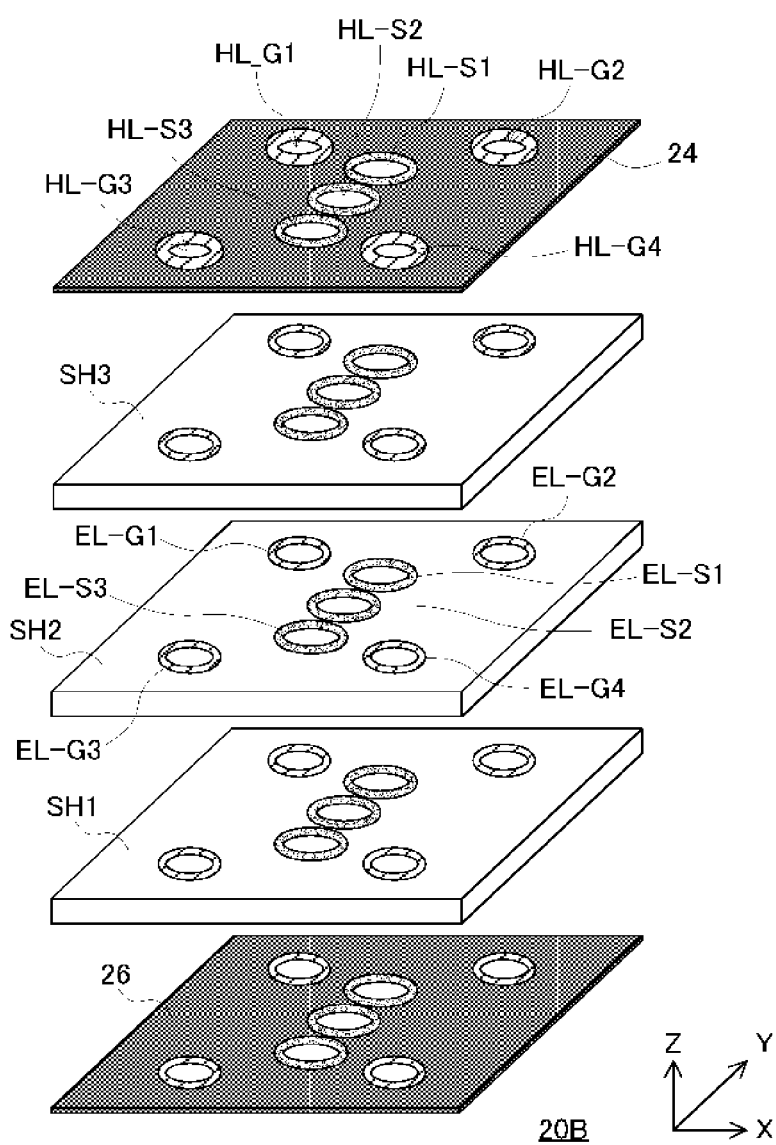
FIG. 17 is an exploded view showing a state in which the connector, on which the flat cable shown in FIG. 16 is mounted, is enlarged.

The connector 20B to which the above-described flat cable 30B is mounted is configured as shown in FIG. 17. Referring to FIG. 17, through holes HL-S1 to HL-S3 are provided instead of the through hole HL-S of the connector 20. The through hole HL-S2 extends in the Z-axis direction from a position at the center of the upper surface of the connector 20B, and reaches the lower surface of the connector 20B. Also, the through hole HL-S1 extends in the Z-axis direction from a position at the positive side in the Y-axis direction with respect to the through hole HL-S2, and reaches the lower surface of the connector 20B. Further, the through hole HL-S3 extends in the Z-axis direction from a position at the negative side in the Y-axis direction with respect to the through hole HL-S2, and reaches the lower surface of the connector 20B.

Also, a conductive film EL-S1 is provided on the inner peripheral surface of the through hole HL-S1, a conductive film EL-S2 is provided on the inner peripheral surface of the through hole HL-S2, and a conductive film EL-S3 is provided on the inner peripheral surface of the through hole HL-S3. When the flat cable 30B is mounted on the connector 20B, the signal columnar conductors PR-S1 to PR-S3 are respectively inserted into the through holes HL-S1 to HL-S3. Accordingly, the signal columnar conductors PR-S1 to PR-S3 are respectively connected with the conductive films EL-S1 to El-S3.

Figure 18:
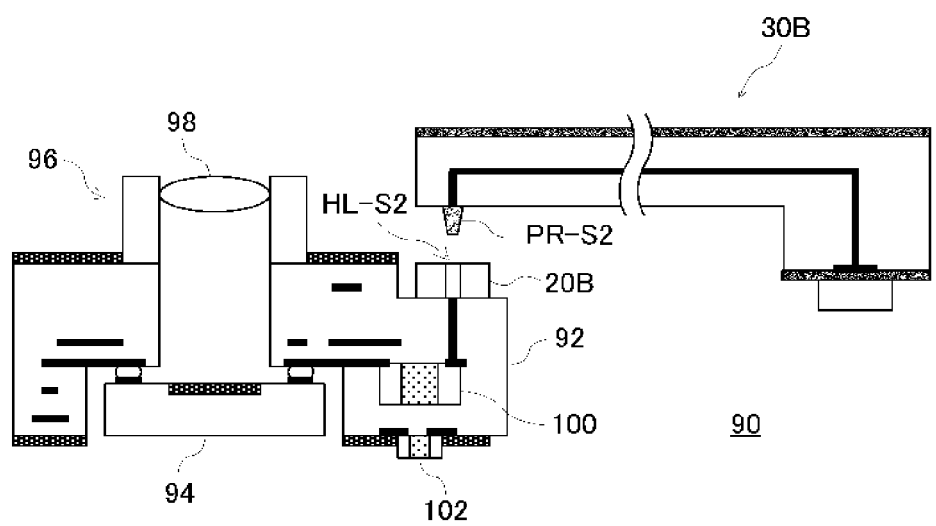
FIG. 18 is a cross-sectional view of a primary portion showing a portion of a camera module that includes the flat cable shown in FIG. 16 and the connector shown in FIG. 17.

The flat cable 30B and the connector 20B are mounted on a camera module 90 in a manner shown in FIG. 18. Referring to FIG. 18, the camera module 90 preferably includes a larger number of layers than the number of layers of the flat cable 30B. The camera module 90 includes a thermoplastic module substrate which is slightly harder than the flat cable 30B. The connector 20B is mounted on the module substrate 92. Also, an image sensor IC 94 and a lens unit 96 including a lens 98 are mounted on the module substrate 92. Further, passive elements such as inductor elements 100 and 102 are embedded in the module substrate 92.

In this preferred embodiment, the columnar conductors PR-S1 to PR-S3, and PR-G1 to PR-G4 are provided on the flat cable 30B, and the through holes HL-S1 to HL-S3, and HL-G1 to HL-G4 are provided in the connector 20B. Alternatively, the columnar conductors PR-S1 to PR-S3, and PR-G1 to PR-G2 may be provided on the connector 20B, and the through holes HL-S1 to HL-S3, and HL-G1 to HL-G2 may be provided in the flat cable 30B.

Also, referring to FIGS. 14 and 15, the single signal columnar conductor PR-S preferably protrudes to the upper side from the position at the negative side in the X-axis direction with respect to the center of the upper surface of the connector 20A, and the single through hole HL-S including the inner peripheral surface provided with the conductive film EL-S is provided at the position at the negative side in the X-axis direction with respect to the center of the principal surface of the end portion 32t of the cable 30A. Alternatively, a plurality of signal columnar conductors may be provided on the connector 20A instead of the signal columnar conductor PR-S, and a plurality of through holes may be provided in the cable 30A instead of the through hole HL-S, so that a plurality of transmission conductors each preferably having an elongated shape are provided at the cable 30A instead of the transmission conductor 38.

In this case, a plurality of connection conductors respectively integrated with the plurality of signal columnar conductors are provided at the connector 20A instead of the connection conductor 70, and a plurality of signal terminals respectively connected with the plurality of connection conductors are provided at the connector 20A instead of the signal terminal 74. Further, the plurality of signal terminals provided at the connector 20A are respectively connected with a plurality of signal terminals provided at the wiring substrate 10 for signal transmission. In the flat cable 30A, the plurality of through holes respectively penetrate through the plurality of transmission conductors.

The present invention has been described with reference to various specific preferred embodiments, however, the present invention is not limited to the above-described preferred embodiments.

For example, the element body of the flat cable and the element body of the connector substrate may be each formed by stacking and integrating the plurality of insulating sheets without using an adhesive layer as described above. Alternatively, each element body may be formed by stacking and integrating the plurality of insulating sheets with use of an adhesive layer such as epoxy resin. The multilayer-type flat cable may not be included, and the flat cable may be a monolayer flat cable (microstrip-line type) including a ground conductor on the back surface. The above-described offset-type strip-line structure may not be included, and the structure may be a normal strip line structure in which respective ground layers are symmetrically arranged about a signal line conductor.

Also, the cable is widely used as a signal line configured to transmit mainly a high-frequency signal, and therefore is not limited to a cable configured to connect a feeding circuit (RFIC) with an antenna element.

Also, the ground layer and the signal line conductor may be formed by patterning, for example, etching a metal thin film of a one-side metal sheet or a both-side metal sheet, or by printing conductive paste by pattern printing with use of a screen plate etc.

Also, the interlayer connection conductor configured to connect two ground layers is not limited to the above-described via-hole conductor, and may be a through-hole conductor. The through-hole conductor is a penetrating interlayer connection conductor to which conductivity is applied by plating etc. a through hole penetrating through the element body.

Also, the connector provided with the hole-shaped connection conductor is provided separately from the wiring substrate which is a mother board. Alternatively, a hole-shaped connection conductor may be provided in the wiring substrate, and a protruding conductor of the flat cable may be directly stuck to the hole-shaped connection conductor of the wiring substrate. That is, the connector may also define and serve as the wiring substrate. In this case, the hole-shaped connection conductor of the wiring substrate defines and serves as a fixing portion configured to fix the cable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A fixing structure configured to fix a cable to a wiring substrate, the fixing structure comprising:
   a cable including a first insulating sheet defining a base member, an elongated transmission conductor configured to transmit a signal, a ground conductor, and a connection conductor; and
   a fixing portion provided at the wiring substrate and configured to fix the cable; wherein
   the wiring substrate includes at least one land;
   the fixing portion includes a plurality of second insulating sheets and at least one conductor;
   the plurality of second insulating sheets are connected to the wiring substrate by a conductive joining material;
   the connection conductor of the cable is electrically connected with the fixing portion, and the connection conductor of the cable is electrically connected to the at least one land by the at least one conductor of the fixing portion;
   the ground conductor is provided closer to the fixing portion side of the base member than the transmission conductor;

the ground conductor includes a ring portion that surrounds a perimeter of the connection conductor when the cable is viewed in a planar view;

the connection conductor and the at least one conductor overlap the at least one land when the plurality of second insulating sheets are viewed in the planar view; and at least one of the connection conductor of the cable and the at least one conductor of the fixing portion includes at least one protrusion-shaped connection conductor that protrudes from the corresponding one of the cable and the fixing portion and is inserted into the other one of the cable and the fixing portion.

2. The fixing structure according to claim 1, wherein the at least one conductor of the fixing portion includes a first interlayer connection conductor connecting to the elongated transmission conductor and a plurality of second interlayer connection conductors connecting to the ground conductor; and the first interlayer connection conductor is surrounded by the plurality of second interlayer connection conductors when the plurality of second insulating sheets are viewed in the planar view.

3. The fixing structure according to claim 1, wherein the first insulating sheet is a thermoplastic resin sheet.

4. The fixing structure according to claim 1, wherein the plurality of second insulating sheets are thermoplastic resin sheets.

* * * * *